United States Patent
Dahlen et al.

(10) Patent No.: US 9,977,843 B2
(45) Date of Patent: May 22, 2018

(54) SYSTEMS AND METHODS FOR PROVIDING A LIGHTING CONTROL SYSTEM LAYOUT FOR A SITE

(71) Applicant: KENALL MANUFACTURING COMPANY, Gurnee, IL (US)

(72) Inventors: Kevin Dahlen, Lindenhurst, IL (US); Daniel W. Cooley, Round Lake, IL (US)

(73) Assignee: KENALL MAUFACTURING COMPANY, Kenosha, WI (US)

( * ) Notice: Subject to any disclaimer, the term of this patent is extended or adjusted under 35 U.S.C. 154(b) by 753 days.

(21) Appl. No.: 14/278,404

(22) Filed: May 15, 2014

(65) Prior Publication Data

US 2015/0331969 A1 Nov. 19, 2015

(51) Int. Cl.
*G06F 17/50* (2006.01)
*H05B 37/02* (2006.01)

(52) U.S. Cl.
CPC .......... *G06F 17/50* (2013.01); *G06F 17/5004* (2013.01); *H05B 37/0245* (2013.01)

(58) Field of Classification Search
CPC .. G06F 17/50; G06F 17/5004; H05B 37/0245
USPC .......................................................... 703/1
See application file for complete search history.

(56) References Cited

U.S. PATENT DOCUMENTS

| | | | | |
|---|---|---|---|---|
| 6,118,230 | A * | 9/2000 | Fleischmann | H05B 37/0254 315/294 |
| 6,548,967 | B1 * | 4/2003 | Dowling | G06Q 30/0201 315/307 |
| 6,795,795 | B2 | 9/2004 | Kreichauf | |
| 6,909,921 | B1 * | 6/2005 | Bilger | G05B 15/02 700/14 |
| 7,116,341 | B2 * | 10/2006 | Ohto | G06F 3/04815 345/419 |

(Continued)

OTHER PUBLICATIONS

Sun et al. ("An Implementation of Remote Lighting Control System Based on Zigbee Technology and Soc Solution", IEEE,2008, pp. 629-632).*

(Continued)

*Primary Examiner* — Omar Fernandez Rivas
*Assistant Examiner* — Iftekhar Khan
(74) *Attorney, Agent, or Firm* — Marshall, Gerstein & Borun LLP; Randall G. Rueth

(57) ABSTRACT

Methods and systems for providing a lighting control system layout for a site. The site includes a plurality of floors and a plurality of lighting control system components. In response to a request from a user for the lighting control system layout, a user interface may be provided. The user interface includes a three-dimensional representation of the site. The three-dimensional representation includes a plurality of layers representative of the plurality of floors and a plurality of icons representative of the plurality of lighting control system components. The user may, in turn, perform one or more actions in connection with the provided interface. In response, different and/or additional information about the site, particularly the lighting control system, may be provided in the user interface. The provided lighting control system layout allows users, such as, for example, site managers, to easily navigate, maintain, and mange a lighting control system for a site.

20 Claims, 15 Drawing Sheets

(56) References Cited

U.S. PATENT DOCUMENTS

| | | | | |
|---|---|---|---|---|
| 7,202,613 | B2* | 4/2007 | Morgan | A01M 1/04 315/312 |
| 8,742,686 | B2* | 6/2014 | Zampini, II | H05B 33/0857 257/13 |
| 8,975,827 | B2* | 3/2015 | Chobot | H05B 37/02 315/291 |
| 9,089,227 | B2* | 7/2015 | Pas | A47F 11/10 |
| 9,374,870 | B2* | 6/2016 | Cumpston | H05B 37/0272 |
| 9,510,426 | B2* | 11/2016 | Chemel | H05B 33/0854 |
| 9,629,226 | B2* | 4/2017 | Aggarwal | H05B 37/0272 |
| 2002/0047628 | A1* | 4/2002 | Morgan | G09G 3/14 315/291 |
| 2004/0239494 | A1* | 12/2004 | Kennedy | G06Q 30/02 340/500 |
| 2005/0128751 | A1* | 6/2005 | Roberge | F21K 9/00 362/276 |
| 2006/0002110 | A1* | 1/2006 | Dowling | F21K 9/00 362/249.05 |
| 2006/0085170 | A1* | 4/2006 | Glaser | G06F 17/5009 703/1 |
| 2008/0198159 | A1 | 8/2008 | Liu et al. | |
| 2010/0214948 | A1* | 8/2010 | Knibbe | H04L 12/2803 370/254 |
| 2010/0235206 | A1* | 9/2010 | Miller | E04D 3/352 705/7.11 |
| 2011/0071656 | A1* | 3/2011 | McKiel, Jr. | G06N 5/02 700/90 |
| 2011/0215735 | A1* | 9/2011 | Herbst | H04L 41/0803 315/297 |
| 2012/0297346 | A1 | 11/2012 | Hoffknecht et al. | |
| 2014/0018940 | A1* | 1/2014 | Casilli | G05B 13/048 700/29 |

OTHER PUBLICATIONS

Nunes et al. ("An Architecture for a Home Automation System", IEEE, 1998, pp. 259-262).*

Mowad et al. ("Smart Home Automated Control System Using Android Application and Microcontroller", IEEE, May 2014, pp. 935-939).*

Encelium—Energy Control System Software, Polaris 3D™—Web Based Control Software, 2 pages.

* cited by examiner

SYSTEMS AND METHODS FOR PROVIDING A LIGHTING CONTROL SYSTEM LAYOUT FOR A SITE

TECHNICAL FIELD

This application generally relates to lighting control systems and, more particularly, to providing a lighting control system layout for a site.

BACKGROUND

Sites, such as commercial buildings, industrial buildings, parking structures, or transportation areas or structures, or the like, tend to be equipped with lighting control systems. These lighting control systems typically include a number of components such as, for example, luminaires or light fixtures, sensors, switches, or the like. Navigating, maintaining, and managing these lighting control systems can be challenging for site managers, particularly when the site or lighting control system is complex and/or the lighting control system includes an extensive number of components. Site managers may, for example, find it difficult to monitor and/or gather information about certain components, not realize the relationship between various components, or have difficulty changing parameters (e.g., lighting levels, emergency schedules), or the like.

SUMMARY

One aspect of the present disclosure provides a computer-implemented method. The method includes receiving a request from a user for graphical information about a site. The site includes a plurality of floors and a plurality of lighting control system components. The method includes providing, in response to the request, a user interface that includes a three-dimensional representation of the site layout. The three-dimensional representation includes a plurality of layers representative of the plurality of floors and a plurality of icons representative of the plurality of lighting control system components. The method includes receiving data indicative of a user action in the user interface, the user action being associated with an icon of the plurality of icons. The method also includes providing, in response to the data indicative of the user action, information in the user interface about the component represented by the icon. The information includes one or more parameters associated with the component. The one or more parameters include a function of the component and/or a type of the component. The method further includes changing, in response to a user selection in the user interface, one or more of the parameters provided in the information and associated with the component.

Another aspect of the present disclosure provides a system that includes a site database and a server. The site database is configured to store data about a lighting control system for a site. The site includes a plurality of floors and the lighting control system includes a plurality of lighting control system components. The server is configured to receive a request from a user for a layout of the lighting control system for the site. In response to the request, the server is configured to access the site database and generate a user interface. The user interface includes a three-dimensional representation of the site, the three-dimensional representation including a plurality of layers representative of the plurality of floors and a plurality of icons representative of the plurality of lighting control system components. The server is configured to receive data indicative of a user action in the user interface, the user action associated with an icon of the plurality of icons. In response to the data indicative of the user action, the server is configured to provide information in the user interface about the component represented by the icon, the information including one or more parameters associated with the component. The one or more parameters include a function of the component and/or a type of the component. In response to a user selection in the user interface, the server is configured to change one or more of the parameters provided in the information and associated with the component.

Yet another aspect of the present disclosure provides a system for providing a lighting control system layout for a site, the site including a plurality of floors and a lighting control system including a plurality of lighting control system components. The system includes a communication module adapted to communicate data, a memory adapted to store non-transitory computer executable instructions, and a processor adapted to interface with the communication module. The processor is configured to execute the non-transitory computer executable instructions to cause the processor to: receive, via the communication module, a request from a user for the lighting control system layout for the site; provide, via the communication module, a user interface including a three-dimensional representation of the site, the three-dimensional representation including a plurality of layers representative of the plurality of floors and a plurality of icons representative of the plurality of lighting control system components; receive, via the communication module, data indicative of a user action in the user interface, the user action associated with an icon of the plurality of icons; provide, via the communication module, in response to the data indicative of the user action, information in the user interface about the component represented by the icon, the information including one or more parameters associated with the component, the one or more parameters comprising a function of the component and/or a type of the component; and change, in response to a user selection in the user interface, one or more of the parameters associated with the component.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed embodiments, and explain various principles and advantages of those embodiments.

FIG. 5D depicts a third screen of the user interface including general information about the site of FIG. 1;

FIGS. 5G-5G2 depict a second overlay including information about one of the zones of the site.

DETAILED DESCRIPTION

The present disclosure is generally directed to providing a lighting control system layout for a site. The site includes a plurality of floors and a plurality of lighting control system components. In response to a request from a user for the lighting control system layout, a user interface may be provided. The user interface includes a three-dimensional representation of the site. The three-dimensional representation includes a plurality of layers representative of the plurality of floors and a plurality of icons representative of the plurality of lighting control system components. The user may, in turn, perform one or more actions in connection with the provided interface. The user may, for example, adjust, select, highlight, and/or hover over one or more portions of the user interface. In response, different and/or additional information about the site, particularly the lighting control system, may be provided in the user interface.

The provided lighting control system layout allows users, such as, for example, site managers, to easily navigate, maintain, and mange a lighting control system for a site. This is particularly true when the site is complex and/or the lighting control system involves an extensive number of components. Users may, for example, use the layout to monitor and/or gather information about certain components, understand the relationship between various components, and/or quickly and easily change parameters (e.g., lighting levels, scheduling) associated with one or more of the various components. It should be appreciated that additional advantages and benefits are envisioned.

Figure 1:
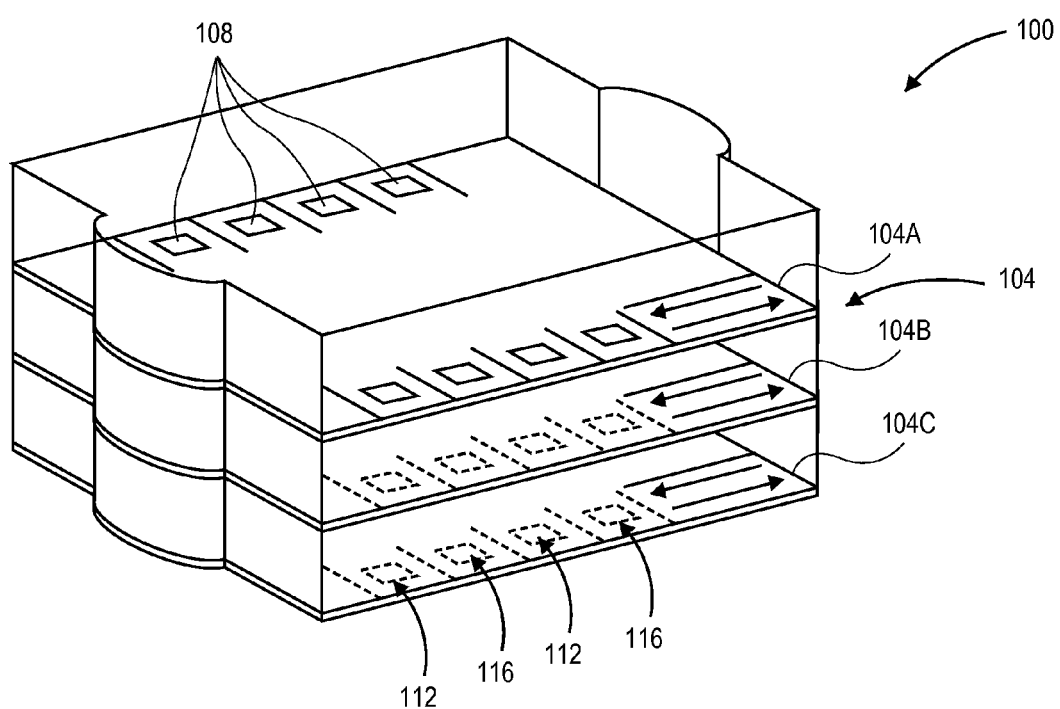
FIG. 1 depicts one example of a site.

FIG. 1 illustrates an example site or facility 100. The site 100 may be a commercial building (e.g., a grocery store), a parking garage, a municipal entity (e.g., City Hall), an educational building (e.g., a high school), a residential home, a transportation structure (e.g., a bus station), or other indoor or outdoor space or environment. Alternatively, the site 100 may represent a combination or portions of one or more of the foregoing described structures or environments. The site 100 generally includes or has one or more floors 104 and one or more networks, which may be or include one or more wireless networks, wired networks, or combinations thereof. In this example, the site 100 includes three floors 104A, 104B, and 104C. In other examples, the site 100 can include more or less floors 104, such as, for example, one floor 104, two floors 104, five floors 104, or any other number of floors 104. Though not depicted herein, each of the floors 104 can include one or more rooms, one or more doors, one or more internal walls, one or more flights of stairs, one or more elevators, one or more cubicles, one or more heating and/or cooling systems, one or more parking spaces, other structures, or combinations thereof.

The site 100 includes or has a lighting control system 108. The lighting control system 108 generally includes components, such as luminaires, sensors, switches, extenders, gateways, or the like, installed at, on, or in different portions of the site 100. The components are generally configured to provide and control illumination for the site 100. In this example, the lighting control system 108 includes a plurality of luminaires 112 and a plurality of sensors 116 installed at, on, or in different portions of the floors 104A, 104B, and 104C. It will be appreciated that the luminaires 112 and the sensors 116 can be installed on, at, or in a ceiling, a wall, a ground, or other location of the floors 104A, 104B, and 104C. As understood in the art, each luminaire 112 includes one or more light-emitting components, such as light-emitting diodes (LEDs), fluorescent lamps, incandescent bulbs, or plasma lights, that, when powered, illuminate an area of the site 100 proximate to or in a vicinity of the respective luminaire 112. It should be appreciated that the luminaires 112 need not be uniform (i.e., the plurality of luminaires 112 can be of different types, sizes, model numbers, etc.). As understood in the art, the sensors 116 can be motion sensors (e.g., occupancy sensors, vacancy sensors), light sensors, other types of sensors, or combinations thereof, for facilitating the efficient use of the luminaires 112. Like the luminaires 112, the sensors 116 need not be uniform (i.e., the plurality of sensors 116 can be of different types, sizes, model numbers, etc.). It should be appreciated that the plurality of components 108 may be powered by an electric circuit and may be connected to the one or more networks of the site 100, and, thus, connected to one other. Further, it should be appreciated that the plurality of components 108 may connect to and, once commissioned, may be controlled by a central controller or similar device or component.

Figure 2:
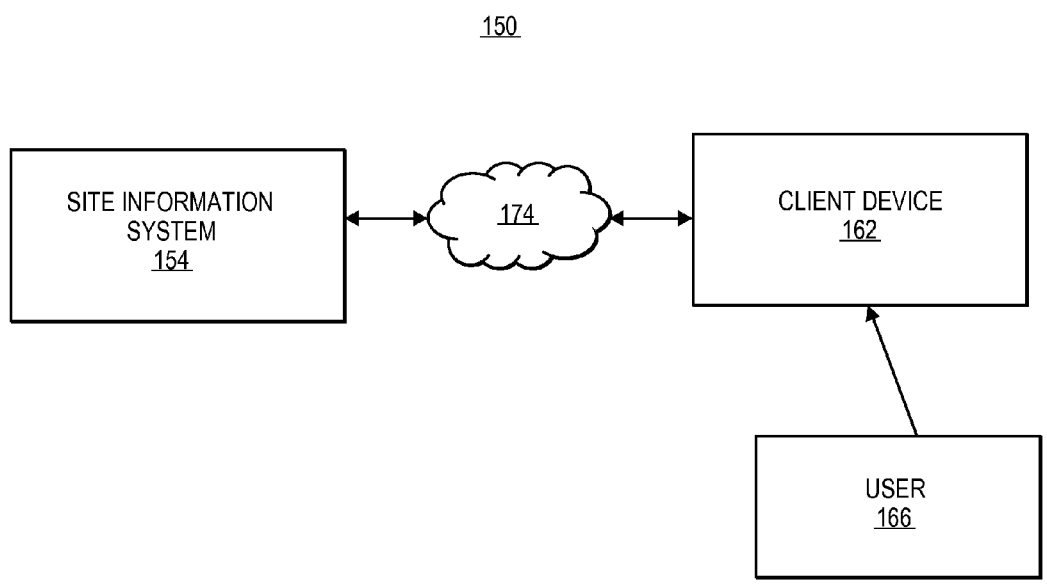
FIG. 2 depicts one example of an environment for providing a lighting control system layout for the site of FIG. 1.

FIG. 2 shows a block diagram of one example of an environment 150 for providing a lighting control system layout for the site 100. The environment 150 generally includes a site information system 154 and a client device 162 associated with (e.g., owned or operated by) a user 166. The user 166 will often, but need not, be a facility or site manager of the site 100. In this example, the site information system 154 is coupled with or connected to the client device 162 via a wired or wireless communication network 174. As used herein, the phrases "in communication" and "coupled" are defined to mean directly connected to or indirectly connected through one or more intermediate components. Such intermediate components may include hardware and/or software based components.

It will be appreciated that the environment 150 may also provide a lighting control system layout for other or multiple sites 100. It will also be appreciated that the environment 150 may include additional, different, or fewer components, such as additional or different site information systems 154 and/or client devices 162. In some examples, the client device 162 may include the site information system 154 (or individual components thereof). In other examples, the site information system 154, or individual components thereof, may be implemented as computer program logic or computer readable program code stored in the memory and/or storage of a computer and executable by one or more processors thereof to implement the disclosed functionality.

The network 174 may be a wireless network or a combination of a wired and wireless networks, such as a cellular telephone network and/or 802.11x compliant network, and may include a publicly accessible network, such as the Internet, a private network, or a combination thereof. The type and configuration of the network 174 is implementation dependent, and any type of communications network which facilitates the described communications between the site information system 154 and the client device 162, available now or later developed, may be used.

Figure 3:
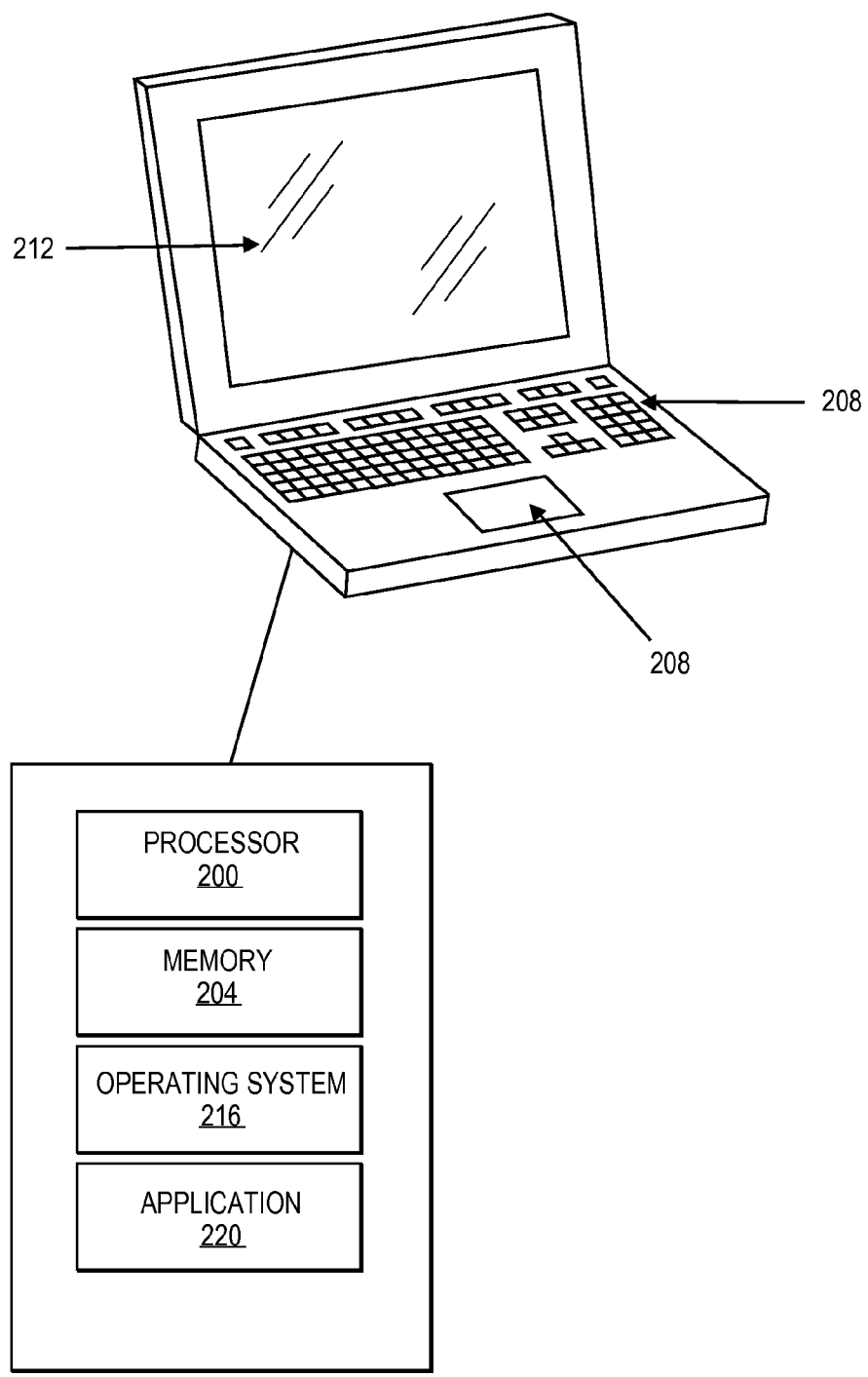
FIG. 3 depicts one example of a client device of the environment of FIG. 2.

FIG. 3 illustrates one example of the client device 162. In this example, the client device 162 is a notebook computer associated with the user 166. In other examples, the client device 162 may be a desktop computer, a workstation, a different type of mobile device, such as a smart phone, a personal digital assistant, or a tablet computer, and/or any other known or later developed device, associated with the user 166. The client device 162 may be located at or proximate to the site 100, or may be remotely located from the site 100.

The client device 162 generally includes a processor 200, a memory 204, an input device 208, and a display 212. The processor 200 may be a general processor, a digital signal processor, ASIC, field programmable gate array, graphics processing unit, analog circuit, digital circuit, any other known or later developed processor, or combinations thereof. The processor 200 operates pursuant to instructions stored in the memory 204. The memory 204 may be a volatile memory or a non-volatile memory. The memory 204 may include one or more of a read only memory (ROM), random access memory (RAM), a flash memory, an electronic erasable program read only memory (EEPROM), or other type of memory. The memory 204 may include an optical, magnetic (hard drive), or any other form of data storage device. The memory 204 may be removable from the client device 162 (e.g., may be a secure digital (SD) memory card).

The input device 208 may be or include one or more buttons, keypads, keyboards, mice, stylist pens, trackballs, rocker switches, touch pads, voice recognition circuits, touch screens, any other device or component for inputting data to the client device 162, or combinations thereof. The user 166 may, for example, request or access a lighting control system layout for the site 100 from the site information system 154 via or using the input device 208. The display 212 may be a liquid crystal display (LCD) panel, light-emitting diode (LED) screen, thin film transistor screen, a touch screen, or another type of display. The display 212 is operable to display or present the lighting control system layout for the site 100 to the user 166.

The client device 162 further includes an operating system 216 and a software application 220. The operating system 216 is installed on or in the memory 204 of the client device 162 or a separate memory. The operating system 216 may be Linux, Microsoft Windows, Android, iOS, Windows CE, MAC OS X, or any other operating system. The software application 220 is installed and executable on the operating system 216. The software application 220 allows the user 166 to obtain, view, and interact with the lighting control system for the site 100, as will be described in greater detail below. The application 220 may be a Web browser (e.g., Firefox, Internet Explorer, Safari), a mobile or smart phone application ("app"), an email application, or other plug in or propriety application built into or installed on the operating system 216. The application 220, or components thereof, may be automatically installed on or built into (e.g., come with) the operating system 216 of the client device 162 or may be obtained (e.g., purchased) by the user 166 and installed on the operating system 216 after the client device 162 has been obtained (e.g., purchased). The application 220 may automatically execute on the client device 162 when the client device 162 is powering up, in response to a request from the user 166, or in response to some other trigger or event. The application 220 may be written in a suitable computer programming language such as C, although other programming languages (e.g., C++, Java, etc.) are also suitable.

Figure 4:
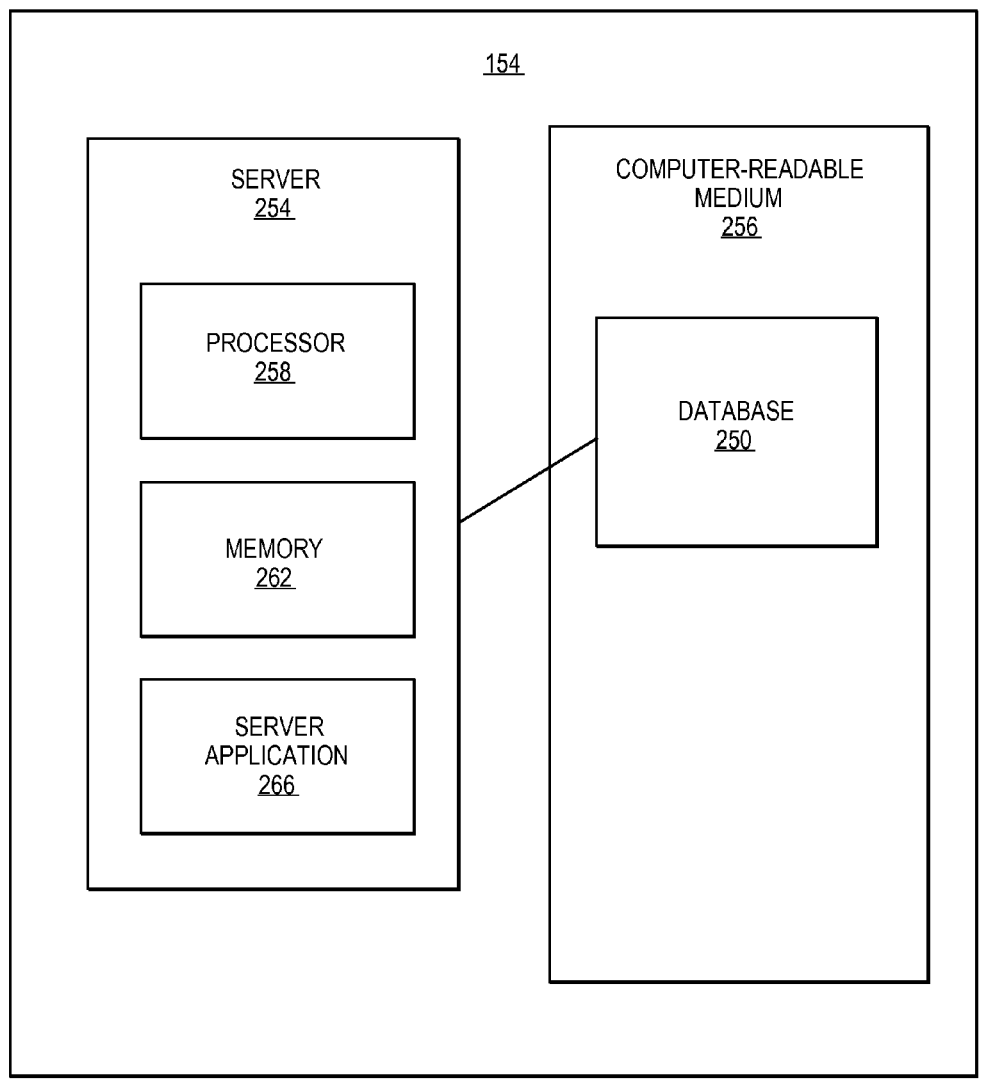
FIG. 4 depicts one example of a site informational system of the environment of FIG. 2.

FIG. 4 illustrates a block diagram of the site information system 154 in greater detail. The site information system 154 generally includes a site database 250 and a server 254. The site database 250 is stored on a computer readable medium 256, which may include one or more hard drives or other storage media. The server 254 may access the computer readable medium 256 and the contents thereof. In other examples, the system 154 may include additional, different, or fewer components. For example, the system 154 may include additional site databases 250 (e.g., one database 250 for each site 100). As another example, the server 254 may be part of or separate (e.g., remote) from the site database 250.

The site database 250 stores or maintains data for or about the site 100. In some examples, the site database 250 can instead or also store or maintain data for or about other sites 100. In any event, the site database 250 may store (i) general data about the site 100, such as, for example, the name of the site 100, the address of the site 100, the status of the site 100 (e.g., pre-commissioning, commissioned, etc.), contact information for the site 100 (e.g., one or more persons to contact, one or more devices to notify, (ii) scheduling data for the site 100, such as, for example, daylight harvesting information, timer information (e.g., a start time, a stop time) emergency scheduling data (e.g., emergency override data), (iii) network information for the site 100, such as, for example, network devices (e.g., routers), addresses (e.g., IP addresses), and network connections, and (iv) structural data about the site 100, such as the number of floors 104, the arrangement of the floors 104, the layout of the floors 104 (e.g., the location of components 108, walls, doorways, cubicles, elevators, etc.). The site database 250 may also store data about the components 108 (e.g., the luminaires 112, the sensors 116) installed on, at, or in various portions of the site 100. Specifically, the database 250 may store parameters associated with each component 108, such as, for example, (i) identifying information about the component 108 (e.g., a name, a model number), (ii) a description of the component 108, (iii) a floor location of the component 108 (e.g., the component 108 is installed on floor 104A), (iv) network information for the component 108 (e.g., the network the component 108 is assigned to), (v) a function of the component 108 (e.g., the component 108 serves as a gateway, a bridge, a repeater, an aggregator, a node, etc.), (vi) a zone associated with the component 108 (e.g., zone 1, zone 2, etc.), (vii) a group associated with the component 108, (viii) a status of the component 108 (e.g., active), (ix) other parameters, or (x) combinations thereof. At least initially, the data stored in the database 250 is default data and/or is entered (e.g., by the user 166) before or during commissioning. As will be described in greater detail below, any of the data stored in the database 250 may be utilized when providing the lighting control system layout for the site 100 to the user 166, and any of this data can be added, deleted, and/or changed in response to the layout for the site 100 being provided to the user 166.

The server 254 may be any type of server, such as, for example, an application server, a database server, a file server, a web server, or other server. The server 254 may include one or more computers and/or may be part of a larger network of servers. As illustrated in FIG. 4, the server 254 includes a processor 258, a memory 262, and a server application 266. The processor 258 and the memory 262 can be similar to or different than the processor 200 and the memory 204 described above. The server application 266 may be stored on one or more hard drives, cache, RAM, or other computer-readable media operated by the server 254 and loaded onto the memory 262 of the server 254 to be executed by the processor 258. The server application 266 is operable to obtain or access the data stored or maintained in the site database 250. In turn, the server application 266 may provide different information, content, services, features, and/or functions to the user 166 via, using, or within the application 220 of the client device 162. The server application 266 may, for example, generate or provide a three-dimensional representation of the site 100 for the user 166. The server application 266 may be written in a suitable computer programming language such as C, although other programming languages (e.g., C++, Java, etc.) are also suitable.

Turning now to the functionalities of the environment 150 illustrated in FIG. 2, when desired, the user 166 can, via or using the application 220 of the client device 158, obtain (e.g., request and receive) the lighting control system layout for the site 100 from the server application 266 over or via the network 174. The server application 266 may, in response to a request from the user 166 for the lighting control system layout for the site 100, provide different outputs of information about the site 100 using or via a user interface 280. In one example, the server application 266 may, in response to such a request, generate the user interface 280 that depicts the lighting control system layout and associated information using or based on the data stored or maintained in the site database 250. In another example, the server application 266 may retrieve a previously generated user interface 280 from the site database 250.

With reference to FIGS. 5A-5D, the user interface 280 in this example includes a plurality of screens 284, 288, 290 accessible via a respective plurality of tabs 294, 298, and 300. The screen 284 is, in this example, the default screen (i.e., it is automatically provided in response to the request from the user 166), though that need not be the case. In other examples, the screen 288, the screen 290, or some other screen may instead be the default screen. In other examples, the user interface 280 may include additional, fewer, or different screens. For example, the user interface 280 need not include the screen 288 and/or the screen 290. As another example, the user interface 280 may include additional screens specifically designed to provide some of the information described herein or other information (e.g., non-lighting parameters, energy trends, etc.).

Figure 5A:
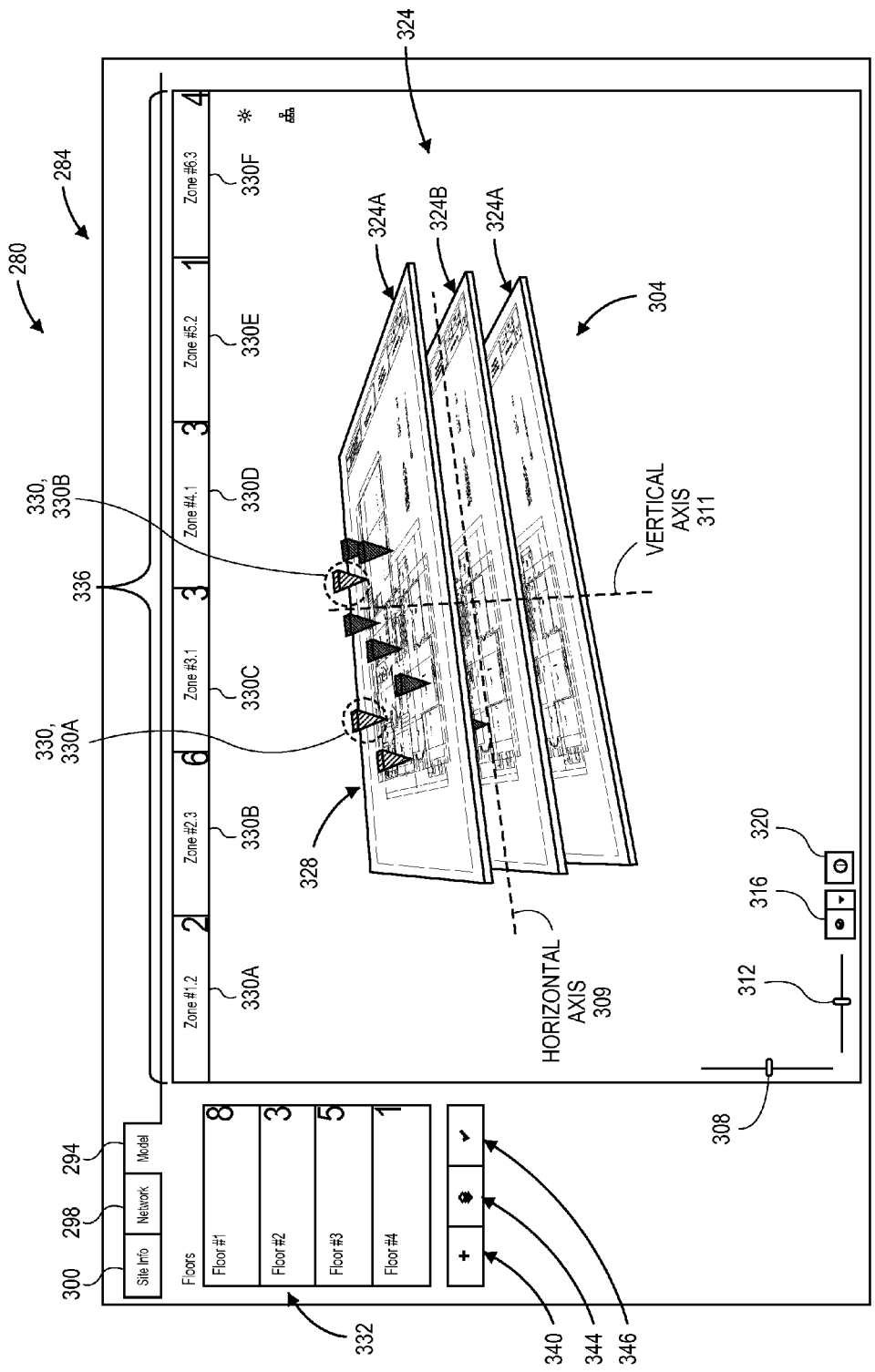
FIG. 5A depicts a perspective view of a first screen of a user interface depicting the lighting control system layout for the site of FIG. 1, the first screen including a three-dimensional representation of the site.
Figure 5B:
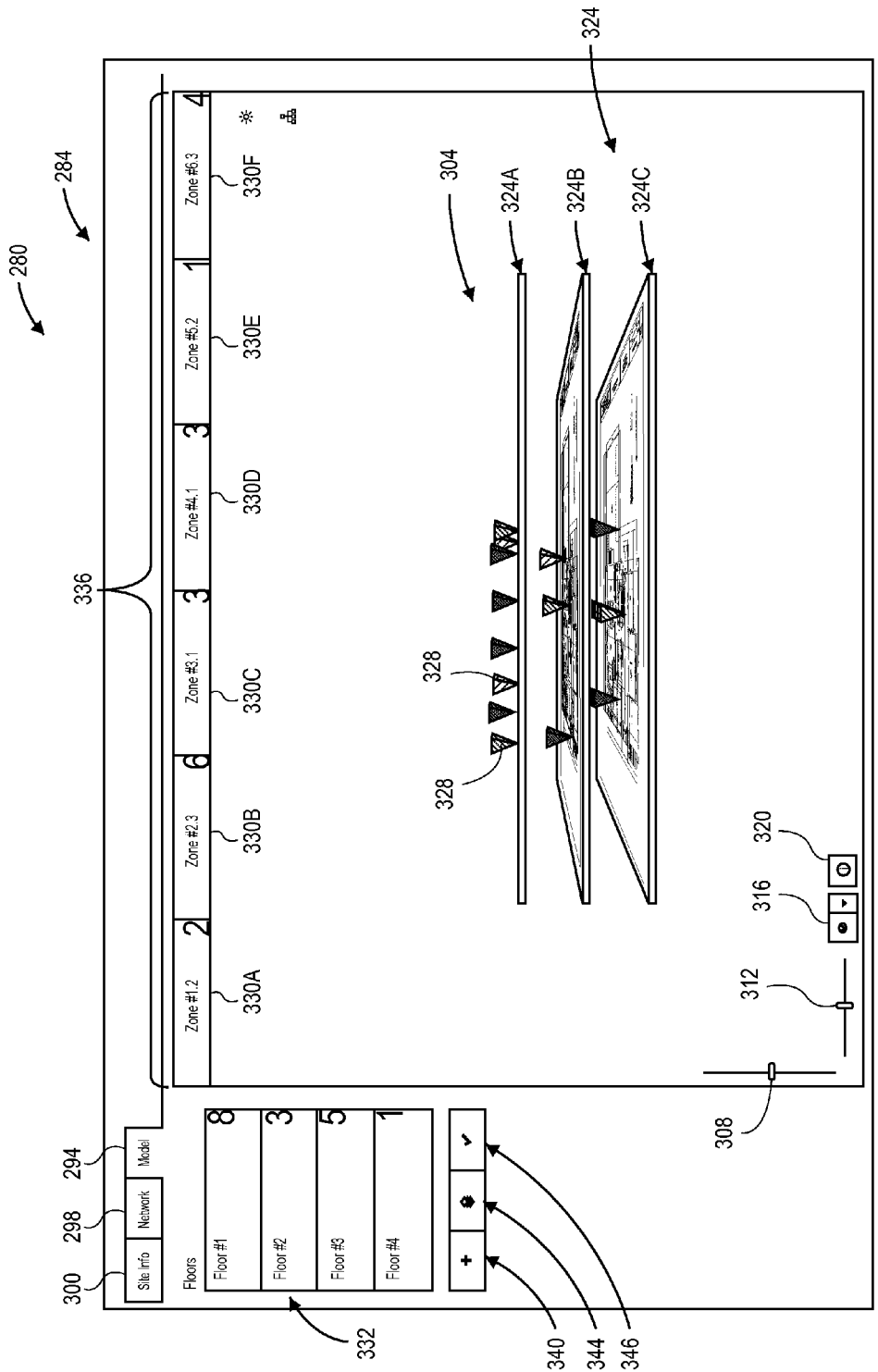
FIG. 5B depicts a side view of the screen illustrated in FIG. 5A.

As illustrated in FIGS. 5A and 5B, the screen 284, which is accessible via the tab 294, includes a three-dimensional representation or model 304 of the site 100, a first slider 308, a second slider 312, a drop-down menu 316, and a button 320. The three-dimensional representation 304 generally includes a plurality of three-dimensional layers 324, which are representative of the floors 104 of the site 100. In this example, because the site 100 includes three floors 104, the three-dimensional representation 304 includes three (3) three-dimensional layers 324A, 324B, and 324C, which are representative of the floors 104A, 104B, and 104C, respectively, of the site 100. In other examples, the three-dimensional representation 304 may include more or less layers 324, depending on the number of floors 104 the site 100 has. The three-dimensional representation 304 also includes a plurality of three-dimensional icons 328, which are representative of the components 108 installed at or in the site 100. Different components 108 (e.g., a luminaire 112 and a sensor 116) and/or components 108 on different floors 104 may be represented by different icons 328 (e.g., icons having a different color, shape, and/or size) or the same icons 328. The three-dimensional representation 304 may also include a plurality of zones 330 for the site 100. One or more components 108 may be assigned to each of the zones 330. For example, zone 330A may include one component 108, represented by the icon 328, on the floor 324A, while zone 330B may include two components 108, represented by the icons 328, on the floor 324A.

The slider 308 controls the vertical orientation of the three-dimensional representation 304. By adjusting the position of the slider 308, the user 166 can rotate the three-dimensional representation 304 about a horizontal axis 309. The slider 312, meanwhile, controls the horizontal rotation of the three-dimensional representation 304. By adjusting the position of the slider 312, the user 166 can rotate the three-dimensional representation 304 about a vertical axis 311. The drop-down menu 316 includes a plurality of different views (e.g., a top view, a side view, a bottom view, a perspective view) and allows the user 166 to change the view of the three-dimensional representation 304 by selecting one of these plurality of different views. The user 166 may, for example, use the drop-down menu 316 to change between the prospective view illustrated in FIG. 5A and the side view illustrated in FIG. 5B. The button 320, when selected, may provide the user 166 with help, such as, for example, information about the various features of the user interface 280.

As illustrated in FIGS. 5A and 5B, the screen 284 in this example also includes a first navigational pane 332, a second navigational pane 336, a first button 340, a second button 344, and a third button 346. The first navigational pane 332 displays the different floors 104A, 104B, and 104C of the site 100 as well as the number of lighting control system components 108 associated with each of the floors 104A, 104B, and 104C. The first navigational pane 332 permits the user 166 to navigate between the different layers 324A, 324B, and 324C, and, thus, the different floors 104A, 104B, and 104C. The second navigational pane 336 displays the different zones 330 of the site 100 as well as the number of lighting control system components 108 assigned to each of the zones 330. In this example, the site 100 includes six zones 330A-330F. In other examples, the site 100 may include more zones 330, less zones 330 (e.g., two zones 330). In another example, the site 100 need not include any zones 330. The second navigational pane 336 permits the user 166 to navigate between the different zones 330. The first button 340 permits the user 166 to add floors 104 to the representation 304 or, when one of the floors 104 is selected, edit the selected floor 104. For example, the user 166 can, via the first button 340, add an additional floor 104 to the representation 304. The second button 344 permits the user 166 to add zones 330 to the representation 304 or, when one of the floors 104 has been selected, add icons 328, representative of components 108, to the selected floor 104. For example, the user 166 can, via the second button 344, add an additional zone 330 to the representation 304. The third button 346 permits the user 166 to save changes or, when one of the floors 104 has been selected, move one or more of the icons 328 to a different portion of the selected floor 104.

Figure 5C:
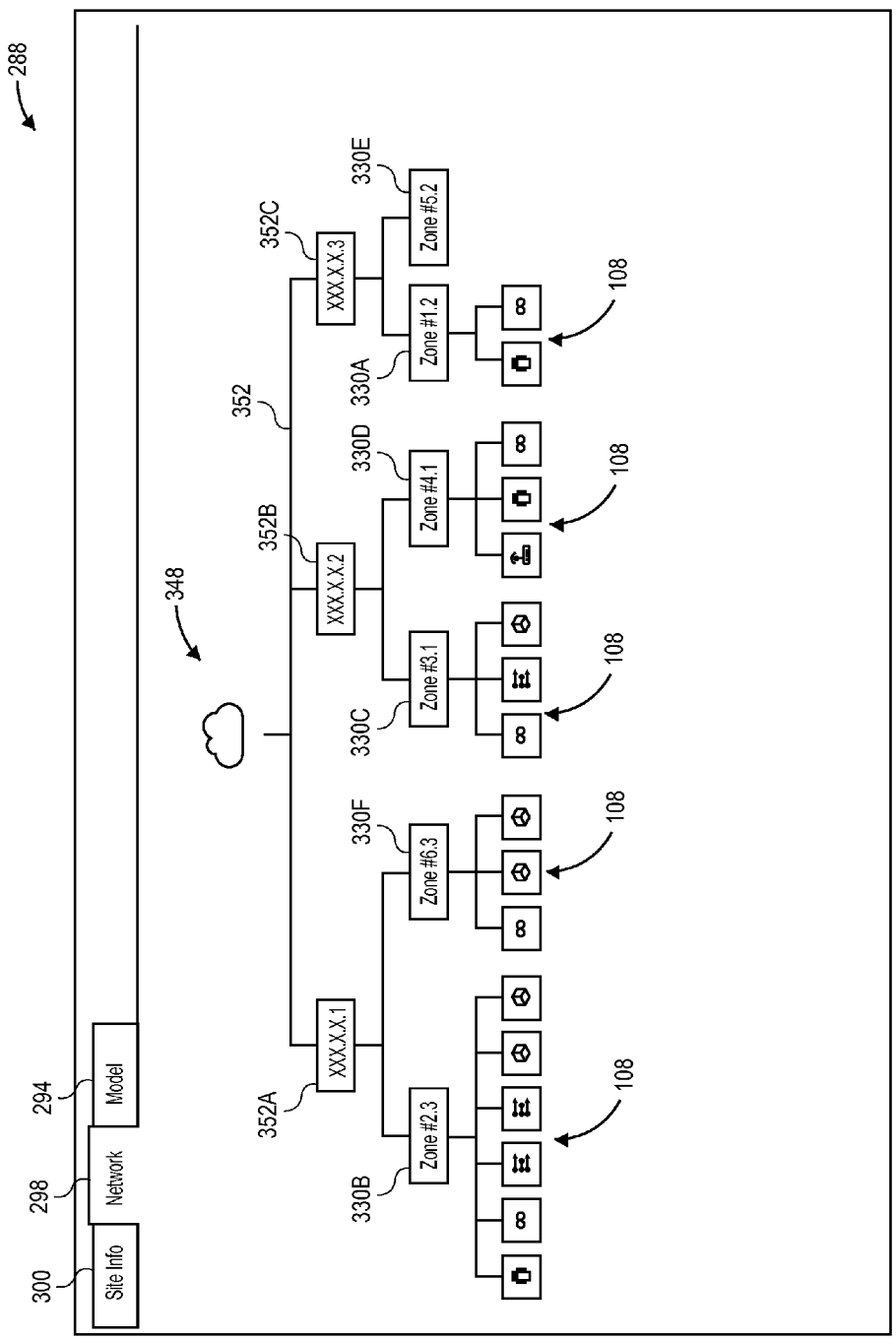
FIG. 5C depicts a second screen of the user interface including the network architecture for the site of FIG. 1.

As illustrated in FIG. 5C, the screen 288, which is accessible via the tab 298, includes or depicts the network architecture 348 for the site 100. The network architecture 348 generally includes one or more network addresses 352 (e.g., IP addresses) for the site 100, the zones 330 assigned to each of the one or more network addresses 352, and the components 108 assigned to each of the one or more zones 330. In this example, the network architecture 348 includes three network addresses 352A, 352B, and 352C. The first network address 352A is assigned to zones 330B, 330F, the second network address 352B is assigned to zones 330C, 330D, and the third network address 352C is assigned to zones 330A, 330E. As such, the first network address 352A is assigned to the components 108 assigned to zones 330B, 330F, the second network address 352B is assigned to the components 108 assigned to zones 330C, 330D, and the third network address 352C is assigned to the components 108 assigned to zones 330A, 330E. It will be appreciated that more or less network addresses 352 may be utilized, the network addresses 352A, 352B, and 352C may be assigned to different zones 330 (or none at all), and/or the components 108 may be assigned to different zones 330 (or none at all).

Figure 5D:
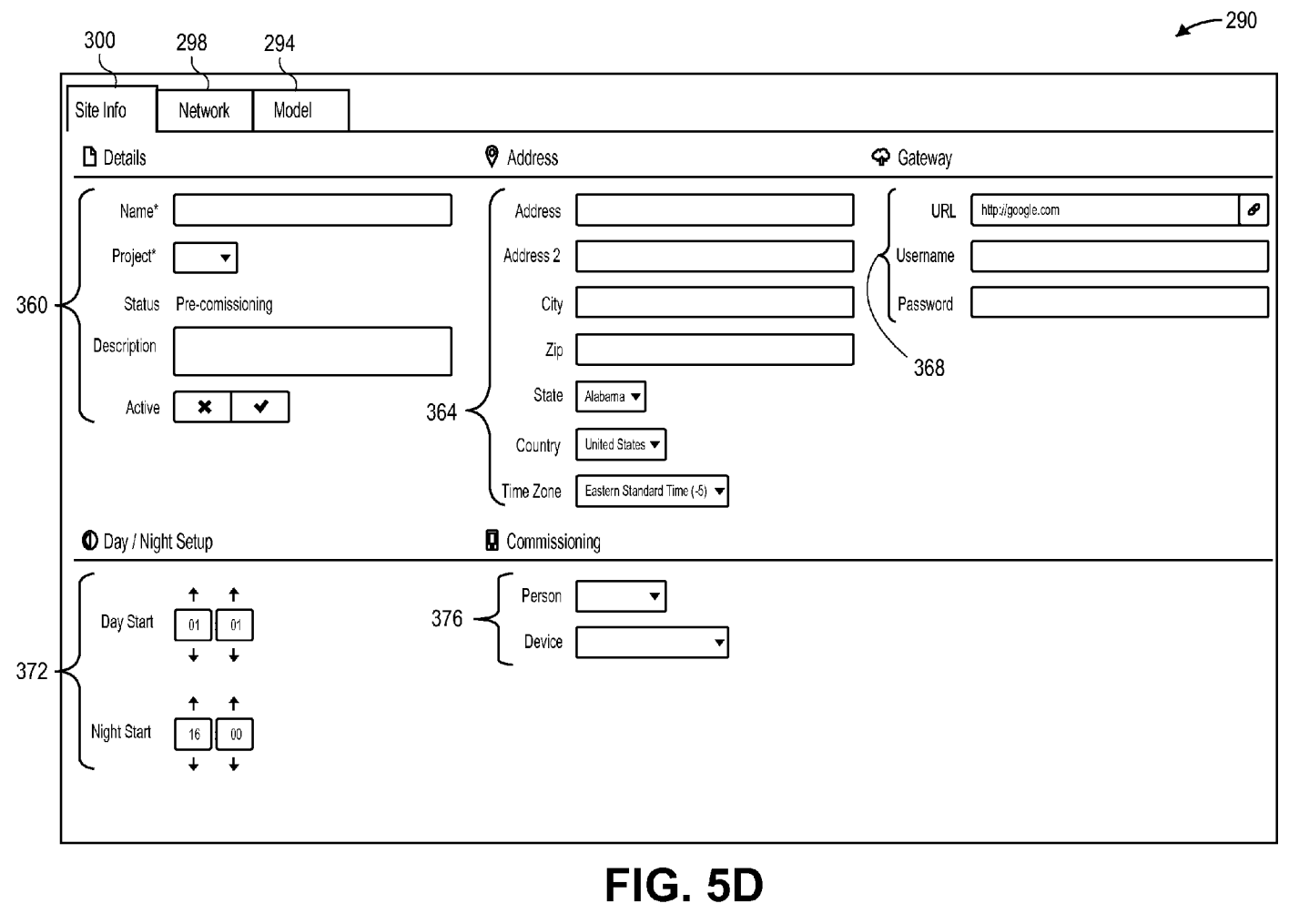

As illustrated in FIG. 5D, the screen 290, which is accessible via the tab 300, includes or depicts general information for the site 100. The general information includes basic details 360, address information 364, gateway information 368, scheduling information 372, and commissioning information 376 for the site 100. The basic details 360 may, for example, include a name of the site 100, a project name for the site 100, a status of the site 100 (e.g., commissioned, in the process of being commissioned), a description of the site 100, other details, or combinations thereof. The address information 364 may, for example, include street, city, zip code, state, country, and/or time zone information for the site 100. The gateway information 368 may include, for example, the URL and log-in information (e.g., username, password). The scheduling information 372 may, for example, include a day start time (e.g., 6:00 A.M.) and a night start time (e.g., 5:00 P.M.). The commissioning information 376 may, for example, include contact information (e.g., a person, a device, an email address) responsible for commissioning the site 100. It will be appreciated that the screen 290 may include additional, different, or less general information about the site 100. For example, the screen 290 may include comparative energy trends for the site 100, other non-lighting parameters (e.g., temperature, air quality) associated with the site 100, or additional information about the user 166 (as well as other users 166).

The server application 266 is operable to provide (e.g., transmit) the user interface 280 to the client device 158. In turn, the processor 204 of the client device 158 may provide (e.g., present, display), to the user 166, the user interface 280 on the display 212 of the client device 158. The user interface 280 is provided to the user 166 in or via the application 220 of the client device 158, but may, in other examples, be provided to the user 166 in a different way (e.g., via e-mail or short-message service). The user 166, via the user interface 280, may easily view and navigate through the lighting control system, the network architecture, and other general information for or about the site 100.

The user 166 may, using or via the input device 208 of the client device 158, perform one or more actions in connection with the provided user interface 280. The one or more actions may include adjusting, selecting (e.g., clicking), highlighting, hovering over, or combinations thereof, one or more portions of the user interface 280 using or via the input device 208. The user 166 may generally perform the one or more actions in connection with (i) one or more of the layers 324, which are representative of one or more of the floors 104, (ii) one or more of the icons 328, which are representative of one or more components 108, (iii) one or more properties or features of the user interface 280, (iv) other portions of the user interface 280 (e.g., the tab 294, the tab 298, the tab 300, the button 320, the navigational pane 332, the navigational pane 336, the button 340, the button 344, etc.), (v) or combinations thereof. These actions may be performed in the screen 284, 288, 290, or some other screen of the user interface 280. Several example actions will be described in greater detail below.

The server application 266 may, in response to receiving data indicative of one or more of these actions being performed by the user 166 in the user interface 280, provide different and/or additional information about the site 100 in the user interface 280. The server application 266 may, for example, respond by changing the three-dimensional representation 324 in the user interface 280, providing information in the user interface 280 about the component 108 represented by the selected icon 328, adjusting the properties of the user interface 280, or navigating between the different screens 284, 288, 290 of the user interface 280. Several example responses will be described in greater detail below.

Figure 5E:
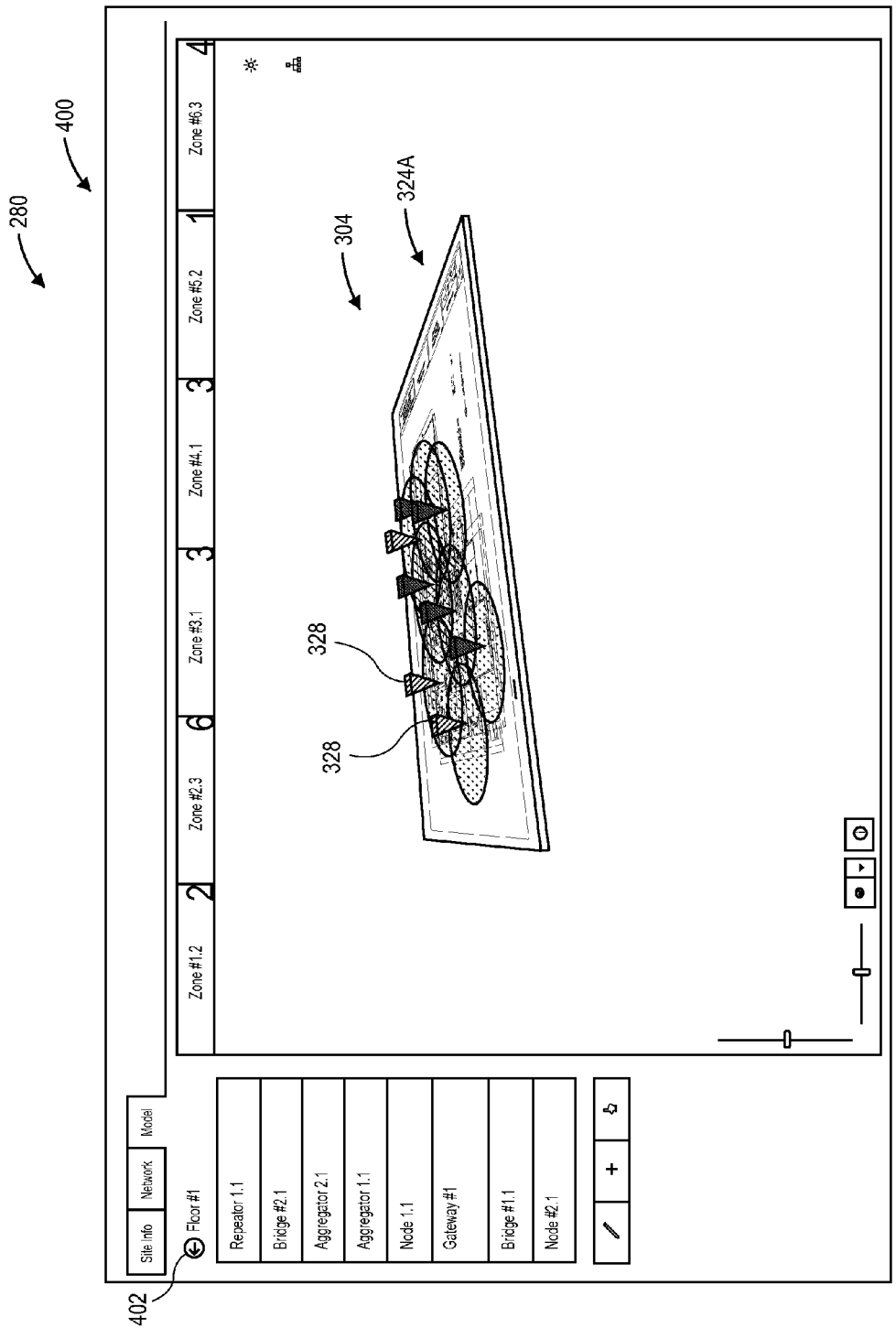
FIG. 5E depicts a perspective view of the first screen of FIG. 5A, but with two of the three layers hidden.

As an example, when the user 166, using or via the input device 208, selects one of the layers 324 in the screen 284 of the user interface 280, the server application 266 is operable to hide or remove the layers 324 other than the selected layer 324, and the icons 328 associated therewith, thereby providing a screen 400 in the user interface 280 in which the three-dimensional representation 304 only includes the selected layer 324. The user 166 may select one of the layers 324 by selecting the desired layer 324 within the three-dimensional representation 304 or by selecting the desired layer 324 in the navigational pane 332. With reference to FIG. 5A, when the user 166, using the input device 208, selects the layer 324A in the screen 284, the server application 266 may hide the layers 324B, 324C and provide the screen 400 depicted in FIG. 5E, wherein the three-dimensional representation 304 only includes the layer 324A and the icons 328 associated with the layer 324 (i.e., the components 108 associated with the floor 104A). This allows the user 166 to view and focus on the layer 324A and the icons 328 associated therewith. Conversely, to bring back the layers 324B, 324C, the user 166 can select an arrow 402 provided in the screen 400.

Figure 5F:
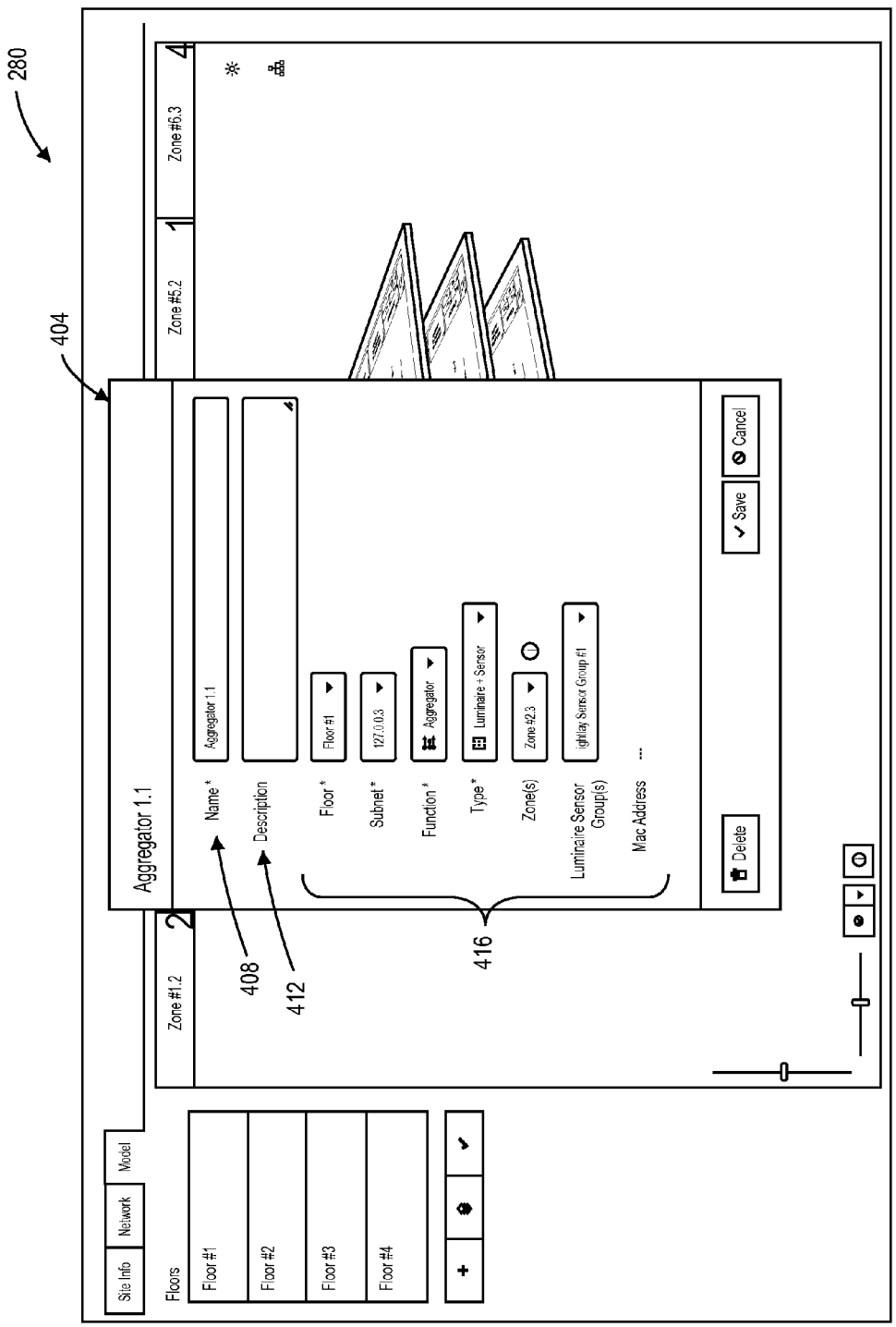
FIG. 5F depicts a first overlay including information about one of the lighting control system components of the site.

As another example, when the user 166, using or via the input device 208, hovers over one of the icons 328 in the screen 284 of the user interface 280, the server application 266 is operable to cause that icon 328 to react by pulsating or vibrating. When the user 166, using or via the input device 208, instead selects one of the icons 328 in the screen 284, the server application 266 is operable to provide an overlay 404 in the user interface 280 that includes information about the component 108 represented by the selected icon 328. Advantageously, the user 166 may penetrate the virtual boundaries of any of the layers 324 in the user interface 280, such that the user 166 may select one of the icons 328 disposed within these boundaries (i.e., one of the icons 328 representative of an interior component 108). One example of the overlay 404 is illustrated in FIG. 5F. In this example, the overlay 404 includes a name 408 of the component, a description 412 of the component, and one or more parameters 416 associated with the component 108. In this example, the one or more parameters 416 include a floor of the component 108 (e.g., the floor 104A, the floor 104B), an IP address assigned to the component 108, a function of the component 108 (e.g., the component 108 is a gateway, a bridge, a repeater, an aggregator, a node, etc.), a type of the component 108 (e.g., the component 108 is a luminaire 112, the component 108 is a sensor 116, the component 108 is a range extender, the component 108 is a combination luminaire and sensor, etc.), a zone to which the component 108 is assigned (e.g., the zone 330A), and a sensor group to which the component 108 is assigned. In other examples, additional, different, or fewer parameters 416 may be provided as part of the overlay 404. The parameters 416 may, for example, only include the function of the component 108 and/or the type of the component 108. It will be appreciated that the information provided in the overlay 404 about the component 108 may be provided directly within or on the screen 284 of the user interface 280 (i.e., the overlay 404 is not necessary).

As a further example, the user 166 may, using or via the input device 208, change or adjust one or more properties or features of the screen 284 of the user interface 280, such as, for example, the orientation, the view, or the zoom level of the three-dimensional representation 304. The user 166 may, for example, using or via the input device 208, (i) adjust the position of the slider 308 and, in turn, change the vertical orientation of the three-dimensional representation 304 (i.e., rotate the representation 304 about the horizontal axis 309), (ii) adjust the position of the slider 312 and, in turn, change the horizontal orientation of the three-dimensional representation 304 (i.e., rotate the representation 304 about the vertical axis 311), (iii) change the view of the three-dimensional representation 304 by selecting a different view from the drop-down menu 316, (iv) increase or decrease the zoom level of the screen 284 (e.g., increase the zoom level of the representation 304), (v) change the position of the three-dimensional representation 304 relative to the other portions of the screen 284 (by, for example, selecting the entire representation 304 and dragging it to a different portion), (vi) or combinations thereof.

Figure 5G:
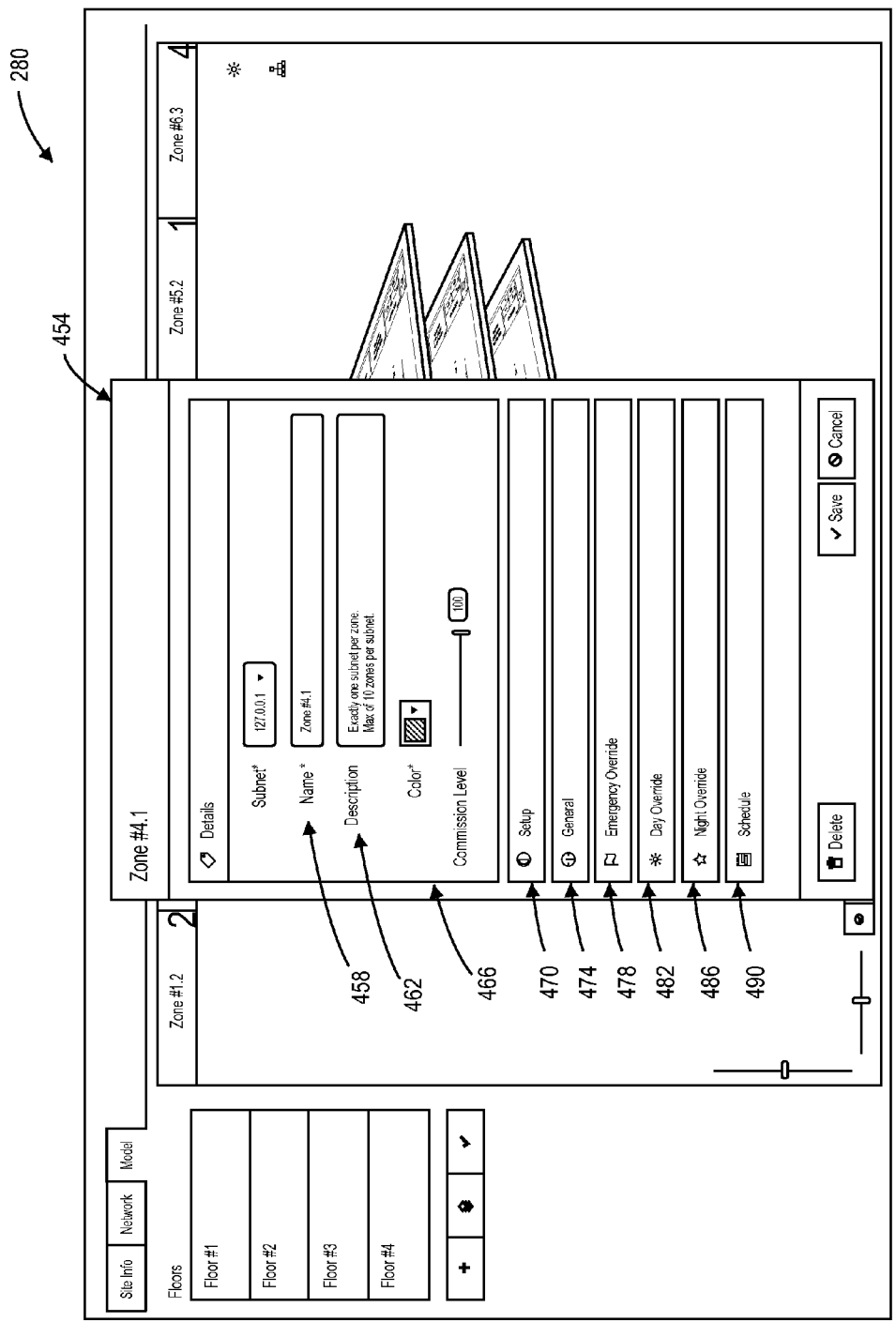
Figures 1, 5G:
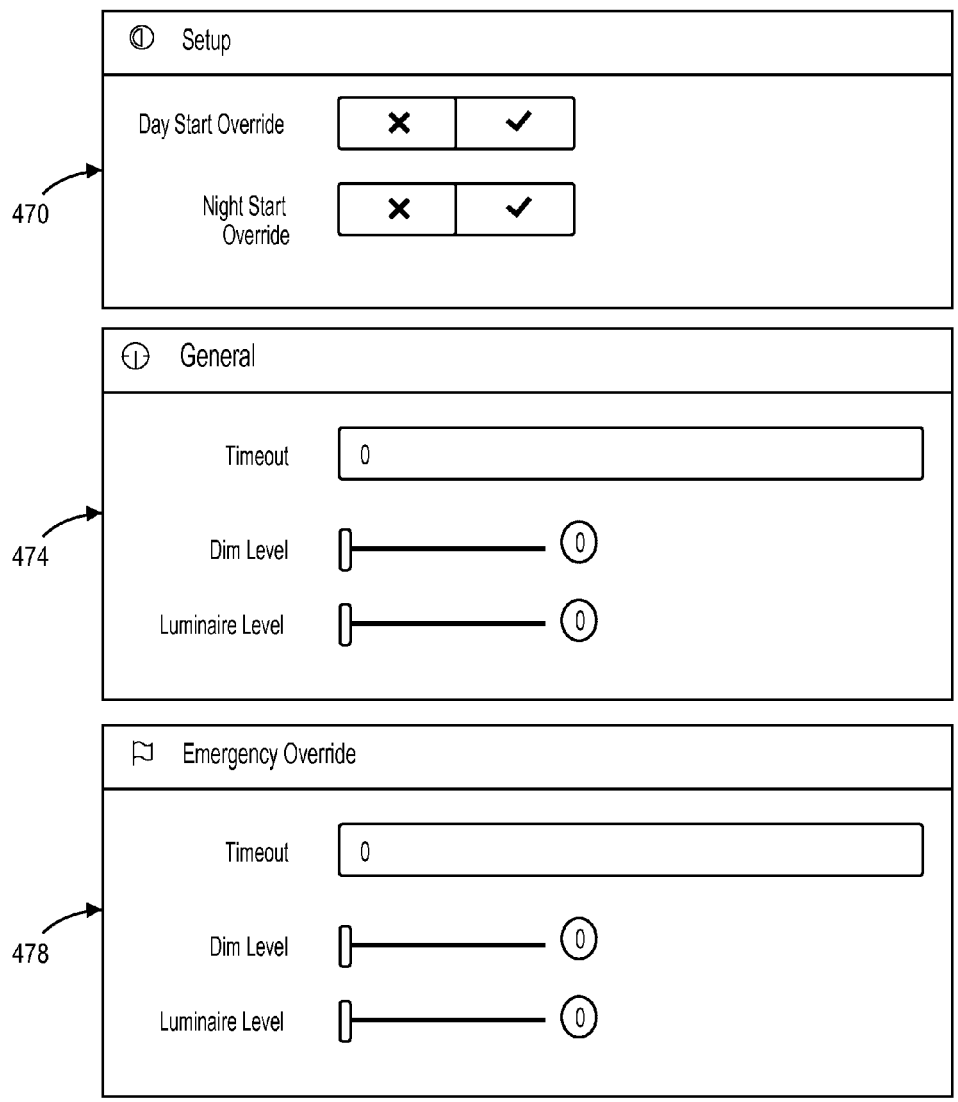

Further yet, the user 166 may, using or via the input device 208, navigate between the different zones 330 using or via the second navigational pane 336 of the user interface 280. When, for example, the user 166 hovers over one of the zones 330A-330F provided in the second navigational pane 336, the server application 266 highlights the one or more icons 328 representative of components 108 associated with that zone 330A-330F and causes those icons 328 to react by pulsating or vibrating. When the user 166 instead selects one of the zones 330A-330F provided in the second navigational pane 336, the server application 266 is operable to provide an overlay 454 in the user interface 280 that includes information about the selected zone 330A-330F. One example of the overlay 454 is illustrated in FIGS. 5G-5G2 for ease of viewing. In this example, the overlay 454 includes details, such as the IP address assigned to the zone 330A-330F, a name 458 of the zone 330A-330F, a description 462 of the zone 330A-330F, and a color 466 of the zone 330A-330F (visible in the user interface 280), as illustrated in FIG. 5G. The information 454 also includes set-up data 470 for the zone 330A-330F (e.g., day start override data, night start override data), default settings 474 for the components 108 assigned to the selected zone 330A-330F (e.g., timeout setting, dim level setting, luminaire level setting), emergency settings 478 for the components 108 assigned to the selected zone 330A-330F (e.g., timeout setting, dim level setting, luminaire level setting), daylight override settings 482 for the components 108 assigned to the selected zone 330A-330F (e.g., timeout setting, dim level setting, luminaire level setting), night override settings 486 for the components 108 assigned to the selected zone 330A-330F (e.g., timeout setting, dim level setting, luminaire level setting), and schedule data 490 (e.g., effective dates), as illustrated in FIGS. 5G-5G2. In other examples, additional, different, or fewer data or settings may be provided as part of the overlay 454. It will be appreciated that the information provided in the overlay 454 may instead be provided directly within or on the screen 284 of the user interface 280 (i.e., the overlay 454 is not necessary).

Figure 5H:
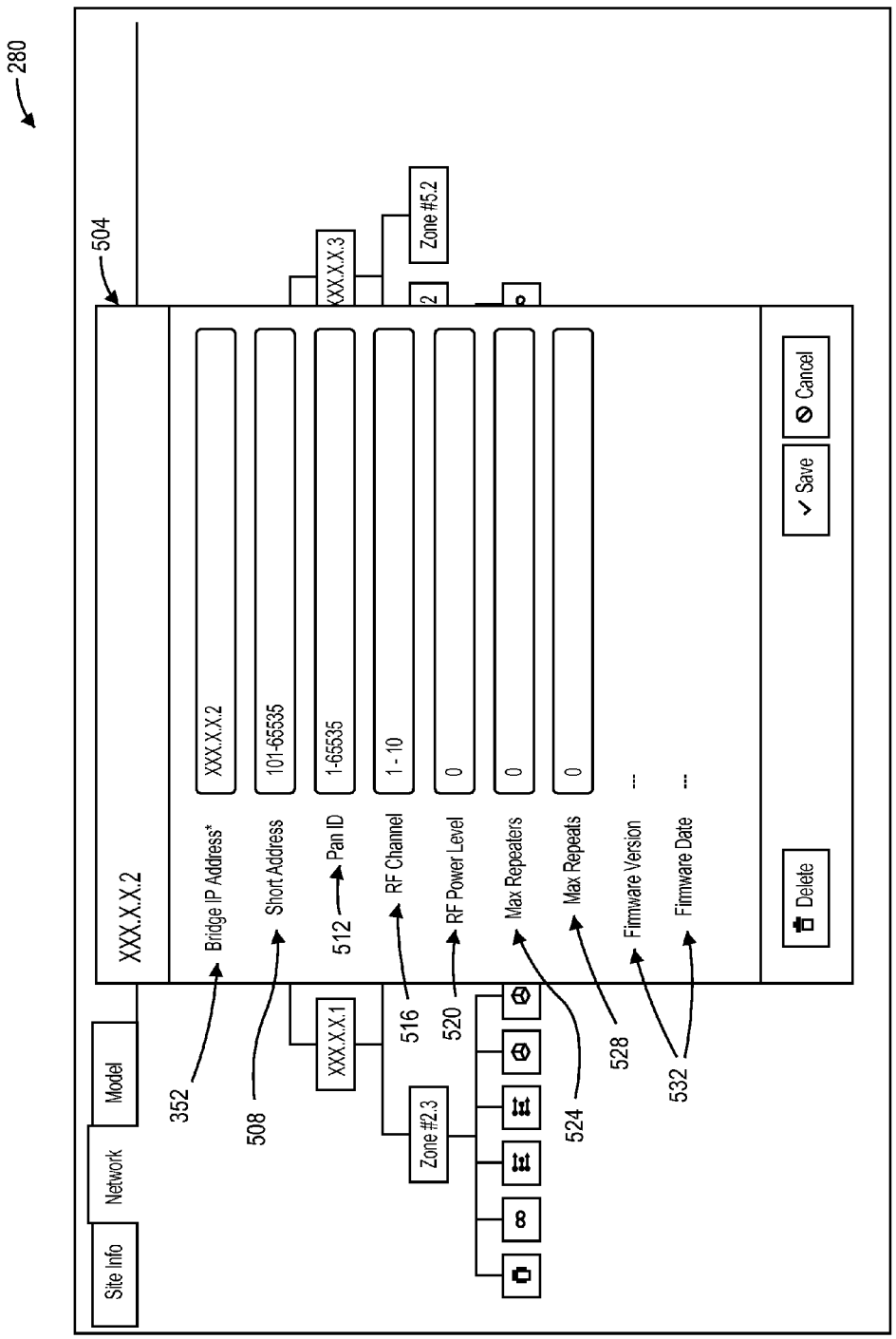
FIG. 5H depicts a third overlay including information about one of the network addresses of the site.

Moreover, the user 166 may, using or via the input device 208, navigate between the screens 284, 288, 290 by selecting the respective tab 294, 298, 300. When, for example, the screen 284 or 288 is provided and the user 166 wishes to view the general information for the site 100, the user 166 may, using or via the input device 208, select the tab 300. In turn, the screen 290 may be provided in the user interface 280. When, for example, the screen 284 or 290 is provided and the user 166 wishes to view the network information for the site 100, the user 166 may, using or via the input device 208, select the tab 298. In turn, the screen 288 may be provided in the user interface 280. The user 166 may, using or via the input device 208, hover over a portion of the network architecture 348 included in the screen 288. When, for example, the user 166 hovers over one of the network addresses 352 included in the network architecture 348, the server application 266 is operable to highlight or illuminate the zones 330A-330F and components 108 to which the respective address 352 is assigned. When, as another example, the user 166 hovers over one of the zones 330A-330F included in the network architecture 348, the server application 266 is operable to highlight or illuminate the components 108 assigned to that respective zone 330A-330F. The user 166 may, using or via the input device 208, select a portion of the network architecture 348 included in the screen 288. When, for example, the user 166 selects one of the components 108 included in the network architecture 348, the server application 266 is operable to provide the overlay 404 described above and illustrated in FIG. 5E. When, for example, the user 166 selects one of the zones 330A-330F included in the network architecture 348, the server application 266 is operable to provide the overlay 454 described above and illustrated in FIG. 5G. When, for example, the user 166 selects one of the network addresses 352 included in the network architecture 348, the server application 266 is operable to provide an overlay 504 in the user interface 280 that includes information about the selected network address 352. One example of the overlay 504 is illustrated in FIG. 5H. In this example, the overlay 504 includes (i) the network address 352, (ii) a short address 508, (iii) a Pan ID 512, (iv) an RF channel 516, (v) an RF power level 520, (vi) a number of maximum repeaters 524, (vii) a number of maximum repeats 528, and (viii) firmware information 532 (e.g., firmware version, firmware date, etc.). In other examples, additional, different, or fewer data or settings may be provided as part of the overlay 504. It will be appreciated that the information provided in the overlay 504 may instead be provided directly within or on the screen 288 of the user interface 280 (i.e., the overlay 504 is not necessary).

In some cases, the real-world layout of the site 100 may change or the user 166 may wish to change the settings (e.g., parameters) of or for the lighting control system for the site 100. Accordingly, it would be desirable to permit the user 166 to easily and quickly update the user interface 280 to reflect any changes made to the layout of the site 100 and/or to quickly and easily change, via the user interface 280, the settings for or about the lighting control system for the site 100. Thus, while the user interface 280 is provided to the user 166, the server application 266 permits the user 166 to change any of the data or information stored in the site database 250 and provided in the screens of the user interface 280, including the settings for or about the lighting control system. Generally speaking, the user 166 may, via the user interface 280, add, delete, or change the layers 324 (representative of adding, deleting, or changing the floors 104 of the site 100), add, delete, or change the icons 328 (representative of adding, deleting, or changing the components 108 of the site 100), add, delete, or change the zones 330, change the network architecture 348 of the site 100 (e.g., provided in the screen 288), change the general information about the site 100, change other information, or combinations thereof. Any of the changes will be reflected in the data stored in the site database 250 and used to generate the user interface 280, such that going forward the user interface 280 will include the changed information. Any changes to the settings or parameters of the lighting control system will also be implemented.

To this end, the user 166 may, using or via the input device 208, change (e.g., update) any of the information or data provided in the screen 284 of the user interface 280. The user 166 may, by selecting the first button 340, add floors 104 or, when a respective one of the floors 104 has been selected, edit the selected floor 104 (e.g., change the name of the floor 104, upload a new layout of the floor 104, delete the floor 104). Likewise, the user 166 may, by selecting the second button 344, add zones 330 or, when a respective one of the floors 104 has been selected, add icons 328, and thus components 108, to the selected floor 104. The user 166 may also, by selecting the third button 346, save changes or, when a respective one of the floors 104 has been selected, move the icons 328, and thus the components 108, on the selected floor 104. Moreover, the user 166 may, by selecting one of the icons 328 in the screen 284, edit the information provided in the overlay 404 in the user interface 280 for the selected icon 328. Because the selected icon 328 represents one of the components 108, the user 166 may, using or via the input device 208, thus edit the information, including the parameters 416, corresponding to the component 108. The user 166 may, for example, edit the name 408 of the component 108, the description 412 of the component 108, and/or one or more parameters 416 associated with the component 108. The user 166 may, for example, edit the function of the component 108 (e.g., change the component 108 from a gateway to a bridge) or edit the type of the component 108 (e.g., change the component 108 from a luminaire 112 to a sensor 112). Furthermore, the user 166 may, by selecting one of the zones 330 in the navigational pane 336, edit the information provided in the overlay 454 in the user interface 280 for the selected zone 330, including the settings for the selected zone 330. The user 166 may, for example, edit the IP address assigned to the selected zone 330, edit the default settings 474 for the selected zone 330, edit the emergency settings 478 for the selected zone 330, edit the daylight override settings 482 for the selected zone 330, or edit the night override settings 486 for the selected zone 330.

Moreover, the user 166 may, using or via the input device 208, change (e.g., update) any of the information or data provided in the screen 288 of the user interface 280. The user 166 may, by selecting one of the network addresses 352 included in the architecture 348, edit the information 504 provided in the user interface 280 for the selected network address 352. The user 166 may, for example, edit the RF channel 516, the RF power level 520, or the number of maximum repeaters 524 for the selected network address 352. The user 166 may, by selecting one of the zones 330 included in the architecture 348, edit the information 454 provided in the user interface 280 for the selected zone 330. The user 166 may, for example, edit the IP address assigned to the selected zone 330, edit the default settings 474 for the selected zone 330, edit the emergency settings 478 for the selected zone 330, edit the daylight override settings 482 for the selected zone 330, or edit the night override settings 486 for the selected zone 330. The user 166 may, by selecting one of the components 108 included in the architecture 348, edit the information provided in overlay 404 in the user interface 280 for the selected component 108. The user 166 may, as noted above, edit the name 408 of the component 108, the description 412 of the component 108, and/or one or more parameters 416 associated with the component 108. The user 166 may, for example, edit the function of the component 108 (e.g., change the component 108 from a gateway to a bridge) or edit the type of the component 108 (e.g., change the component 108 from a luminaire 112 to a sensor 112).

Further yet, the user 166 may, using or via the input device 208, change (e.g., update) any of the information or data provided in the screen 288 of the user interface 280. The user 166 may, by selecting a text box corresponding to any of the general information for the site 100, edit this general information. The user 166 may, for example, edit the name of the site 100, the description of the site 100, the address information 364 for the site 100, or the commissioning information 376 for the site 100.

In response to any changes made by the user 166, the server application 266 is operable to update the data stored in the site database 250 to reflect the user's changes. When, for example, the user 166 edits the name of the site 100, the server application 266 is operable to update the corresponding data in the site database 250. Any changes made by the user 166 will thus be visible the next time the user interface 280 is viewed. When changes are made to the settings or parameters of the lighting control system, these changes will be implemented (e.g., by the central controller).

It will be appreciated that any of the above-described functionalities may be performed in combination with one another. Other functionalities may alternatively or additionally be performed by the user 166 via or using the user interface 280. It will also be appreciated that any of the above-described functionalities may be performed with different components than those described herein. For example, the processor 200 of the client device 158 may, in some cases, perform one or more of these functionalities.

Figure 6:
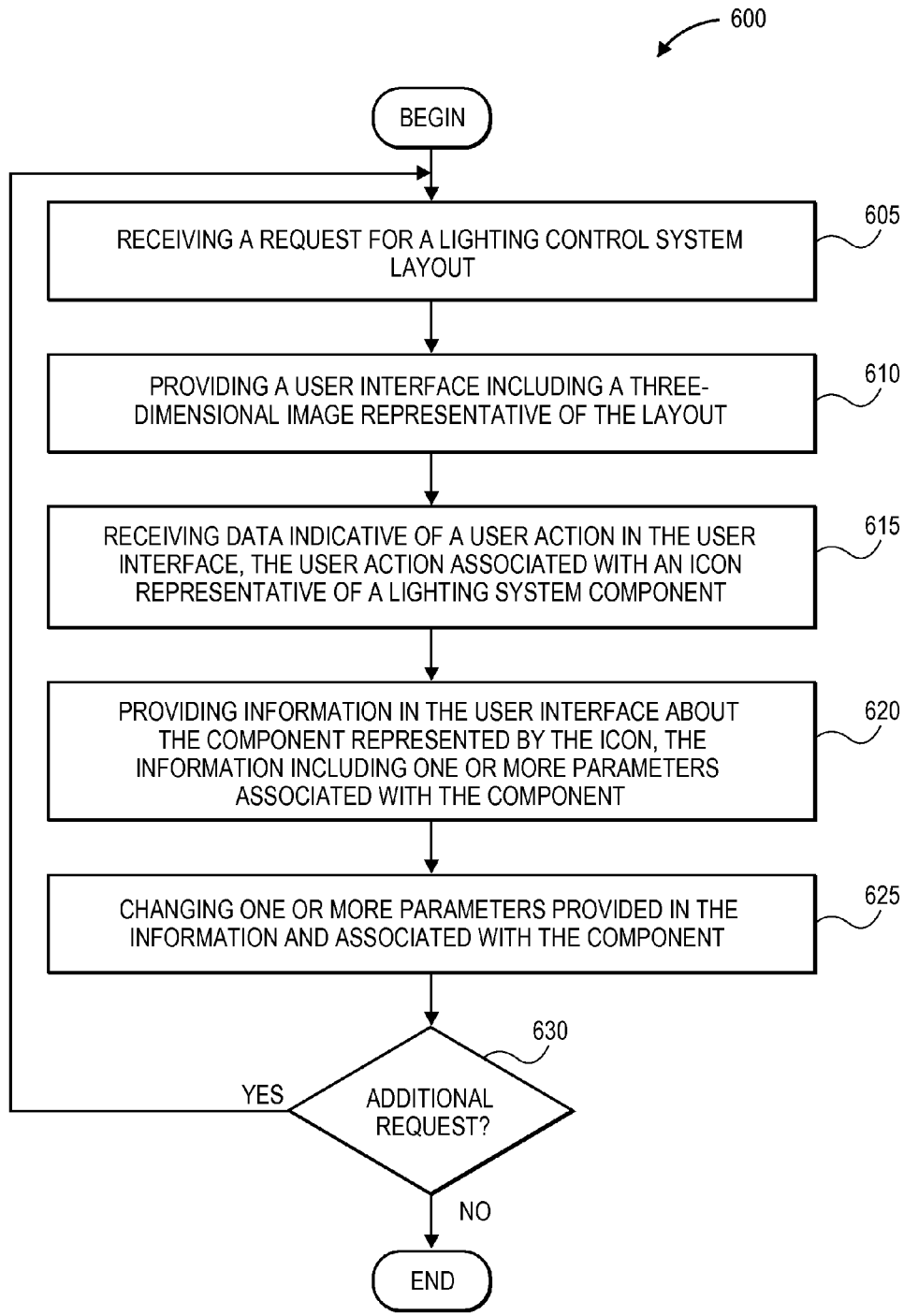
FIG. 6 depicts a flow chart showing one example of a method for providing a lighting control system layout for a site.

FIG. 6 is a flowchart depicting one method 600 for providing a lighting control system layout for a site (e.g., the site 100). The method 600 may be performed by the site information system 154, the client device 158, some other machine or device, the user 166, or combinations thereof. The method 600 is implemented in the order shown, but may be implemented in or according to any number of different orders. The method 600 may include additional, fewer, or different acts. For example, the acts 615, 620, and/or 625 may be repeated any number of times. As another example, each of the acts 600-625 may be repeated any number of times, such as, for example, when another request (act 630) is received.

The method 600 begins when a request is received from a user (e.g., the user 166) for a lighting control system layout for a site (act 605). The request may be received from the user via a client device (e.g., the client device 158) associated with the user. The site may be a commercial building (e.g., a grocery store), a parking garage, a municipal entity (e.g., City Hall), an educational building (e.g., a high school), a residential home, a transportation structure (e.g., a bus station), or other indoor or outdoor space or environment. Alternatively, the site may represent a combination or portions of one or more of the foregoing described structures or environments. The site generally includes or has one or more floors (e.g., the floors 104) and one or more networks, which may be or include one or more wireless networks, wired networks, or combinations thereof. The site also includes or has a lighting control system (e.g., the lighting control system 108). The lighting control system generally includes components, such as luminaires, sensors, switches, extenders, gateways, or the like, installed at, on, or in different portions of the site. The components are generally configured to provide and control illumination for the site.

In response to the request, a user interface (e.g., the user interface 280) is provided (act 610). The user interface includes a three-dimensional representation (e.g., the three-dimensional representation 304) of the site. The three-dimensional representation includes a plurality of layers (e.g., the layers 324) representative of the plurality of floors of the site and a plurality of icons (e.g., the icons 328) representative of the plurality of lighting system components. The three-dimensional representation may, in some examples, include a plurality of zones (e.g., the zones 330) for the site, one or more of the lighting system components being assigned to each of the plurality of zones. The user interface may, in some examples, also provide network architecture (e.g., the network architecture 348) for and/or general information about the site.

In act 615, the method includes receiving data indicative of a user action in the user interface. The user action is generally associated with one or more of the icons, which are representative of one or more lighting system components. One or more other user actions may also be performed in the user interface. These other actions may include adjusting, selecting (e.g., clicking), highlighting, hovering over, or combinations thereof, one or more portions of the user interface using or via an input device (e.g., the input device 208) of the client device. More specifically, the user may perform one or more other actions in connection with (i) one or more of the layers, which are representative of one or more of the floors, (ii) one or more of the icons, which are representative of one or more components (iii) one or more properties or features of the user interface, (iv) other portions of the user interface, (v) or combinations thereof.

In response to the data indicative of the user action in the user interface, information is provided in the user interface (act 620). The information is about the component represented by the icon and includes one or more parameters associated with the component. The one or more parameters include a function of the component and/or a type of the component. The one or more parameters may also include a floor location of the component, network information for the component, a zone associated with the component, a sensor group associated with the component, or combinations thereof. Additional or different information may also be provided in response to user actions in the user interface. For example, the three-dimensional representation in the user interface may be changed, information about one of the zones, or information about one of the network addresses may be provided in the user interface.

In act 625, the method includes changing, in response to a user selection in the user interface, one or more parameters provided in the information and associated with the component. The method may, for example, include changing a type of one of the lighting system components and/or a function of one of the lighting system components.

Based on the foregoing, it should be appreciated that the systems and methods described herein allows users, such as, for example, site managers, to easily navigate, maintain, and mange a lighting control system for a site. This is particularly true when the site is complex and/or the lighting control system involves an extensive number of components. Users may, for example, use the layout to monitor and/or gather information about certain components, understand the relationship between various components, and/or quickly and easily change parameters (e.g., lighting levels, scheduling) associated with one or more of the various components.

While the computer-readable medium is illustrated to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the present specification describes components and functions that may be implemented in particular embodiments with reference to particular standards and protocols, the invention is not limited to such standards and protocols. For example, standards for Internet and other packet switched network transmission (e.g., TCP/IP, UDP/IP, HTML, HTTP, HTTPS) represent examples of the state of the art. Such standards are periodically superseded by faster or more efficient equivalents having essentially the same functions. Accordingly, replacement standards and protocols having the same or similar functions as those disclosed herein are considered equivalents thereof.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

As used in this application, the term 'circuitry' or 'circuit' refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

Processors suitable for the execution of a computer program include, by way of example, both general and special purpose microprocessors, and anyone or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

This detailed description is to be construed as examples and does not describe every possible embodiment, as describing every possible embodiment would be impractical, if not impossible. One could implement numerous alternate embodiments, using either current technology or technology developed after the filing date of this application.

The invention claimed is:

1. A computer-implemented method, comprising:
   receiving a request from a user for a lighting control system layout for a site, the site including a plurality of floors and a lighting control system comprising a plurality of lighting control system components;
   providing, via a processor, in response to the request, a user interface including a three-dimensional representation of the site and a network architecture for the site, the three-dimensional representation including a plurality of layers representative of the plurality of floors and a plurality of icons representative of the plurality of lighting control system components, and the network architecture for the site is presented in a hierarchical arrangement including one or more network addresses for the site and the lighting control system components assigned to each of the one or more network addresses;
   receiving data indicative of a user action in the user interface, the user action associated with an icon of the plurality of icons;
   providing, with the processor, in response to the data indicative of the user action, information in the user interface about the component represented by the icon, the information including one or more parameters associated with the component, the one or more parameters comprising a function of the component and/or a type of the component; and
   changing, with the processor, in response to a user selection in the user interface, one or more of the parameters of the component.

2. The method according to claim 1, wherein the one or more parameters further comprise a floor location of the component, network information for the component, a zone associated with the component, a sensor group associated with the component, or combinations thereof.

3. The method according to claim 1, wherein providing the three dimensional representation of the user interface comprises providing a plurality of zones for the site, one or more of the lighting control system components being assigned to each of the plurality of zones.

4. The method according to claim 1, wherein the hierarchical arrangement further comprises a plurality of zones for the site, each of the plurality of zones being assigned to one of the network addresses, and one or more of the lighting control system components being assigned to each of the plurality of zones.

5. The method according to claim 1, further comprising:
   receiving data indicative of a further user action in the user interface, the user action comprising a selection of one of the plurality of layers in the user interface; and
   removing, via the processor, in response to the receiving, the layers of the plurality of layers not selected by the user from the three-dimensional representation.

6. The method according to claim 1, further comprising changing, via the processor, the user interface based on user adjustment of one or more properties of the user interface, the one or more properties of the user interface comprising an orientation of the three-dimensional representation, a view of the three-dimensional representation, and a zoom level of the three-dimensional representation.

7. The method according to claim 1, wherein providing the user interface comprises including the three-dimensional representation, the three-dimensional representation including at least one icon positioned in an interior of one of the plurality of layers, the at least one icon representative of an interior lighting control system component, and wherein receiving data indicative of the user action in the user interface comprises a selection of the at least one interior icon.

8. A system, comprising:
   a site database configured to store data about a lighting control system for a site, the site including a plurality of floors and the lighting control system comprising a plurality of lighting control system components;
   a server configured to receive a request from a user for a layout of the lighting control system for the site,
   in response to the request, the server is configured to access the site database and generate a user interface including a three-dimensional representation of the site and a network architecture for the site, the three-dimensional representation including a plurality of layers representative of the plurality of floors and a plurality of icons representative of the plurality of lighting control system components, and the network architecture for the site is presented in a hierarchical arrangement including one or more network addresses for the site and the lighting control system components assigned to each of the one or more network addresses;
   the server is configured to receive data indicative of a user action in the user interface, the user action associated with an icon of the plurality of icons,
   the server is configured to provide, in response to the data indicative of the user action, information in the user interface about the component represented by the icon, the information including one or more parameters associated with the component, the one or more parameters comprising a function of the component and/or a type of the component, and
   the server is configured to change, in response to a user selection in the user interface, one or more of the parameters of the component.

9. The system according to claim 8, wherein the server is configured to receive the request and the data indicative of the user action via a client device associated with the user.

10. The system according to claim 8, wherein the plurality of icons comprise a plurality of three-dimensional icons.

11. The system according to claim 8, wherein the one or more parameters further comprise a floor location of the component, network information for the component, a zone associated with the component, a sensor group associated with the component, or combinations thereof.

12. The system according to claim 8, wherein the three-dimensional representation further includes a plurality of zones for the site, one or more of the lighting control system components being assigned to each of the plurality of zones.

13. The system according to claim 8, wherein the hierarchical arrangement further includes a plurality of zones for the site, each of the plurality of zones being assigned to one of the network addresses, and one or more of the lighting control system components being assigned to each of the plurality of zones.

14. The system according to claim 8, wherein the server is to receive data indicative of a further user action in the user interface, the user action comprising a selection of one of the plurality of layers in the user interface, and wherein, in response to the data indicative of the further user action, the server is operable to hide the other layers of the plurality of layers.

15. The system according to claim 8, wherein the server is to change the user interface based on user adjustment of one or more properties of the user interface, the one or more properties of the user interface comprising an orientation of the three-dimensional representation, a view of the three-dimensional representation, and a zoom level of the three-dimensional representation.

16. The system according to claim 8, wherein the three-dimensional representation includes at least one icon positioned in an interior of one of the plurality of layers, the at least one icon representative of an interior lighting control system component, the at least one interior icon being selectable by the user within the three-dimensional representation.

17. A system for providing a lighting control system layout for a site, the site including a plurality of floors and a lighting control system including a plurality of lighting control system components, the system comprising:
    a communication module adapted to communicate data;
    a memory adapted to store non-transitory computer executable instructions; and a processor adapted to interface with the communication module, wherein the processor is configured to execute the non-transitory computer executable instructions to cause the processor to:
    receive, via the communication module, a request from a user for the lighting control system layout for the site;
    generate, by the processor, a user interface including a three-dimensional representation of the site and a network architecture for the site, the three-dimensional representation including a plurality of layers representative of the plurality of floors and a plurality of icons representative of the plurality of lighting control system components, and the network architecture for the site is presented in a hierarchical arrangement including one or more network addresses for the site and the lighting control system components assigned to each of the one or more network addresses;
    receive, via the communication module, data indicative of a user action in the user interface, the user action associated with an icon of the plurality of icons;
    generate, by the processor, in response to the data indicative of the user action, information in the user interface about the component represented by the icon, the information including one or more parameters associated with the component, the one or more parameters comprising a function of the component and/or a type of the component; and
    change, in response to a user selection in the user interface, one or more of the parameters of the component.

18. The system of claim 17, wherein the processor is configured to execute the non-transitory computer executable instructions to further cause the processor to:
    receive data indicative of a further user action in the user interface, the user action comprising a selection of one of the plurality of layers in the user interface; and
    in response to the data indicative of the further user action, hide the other layers of the plurality of layers.

19. The system according to claim 17, wherein the processor is configured to execute the non-transitory computer executable instructions to further cause the processor to change the user interface based on user adjustment of one or more properties of the user interface, the one or more properties of the user interface comprising an orientation of the three-dimensional representation, a view of the three-dimensional representation, and a zoom level of the three-dimensional representation.

20. The method according to claim 3, further comprising:
    receiving data indicative of a further user action in the user interface, the further user action comprising hovering over a zone of the plurality of zones; and
    in response to the receiving, identifying, with the processor, the one or more lighting control system components assigned to the zone.

* * * * *